US009264676B2

(12) United States Patent
Cohen et al.

(10) Patent No.: US 9,264,676 B2
(45) Date of Patent: Feb. 16, 2016

(54) BROADBAND IMAGER

(75) Inventors: David Cohen, Nesher (IL); Giora Yahav, Haifa (IL)

(73) Assignee: Microsoft Technology Licensing, LLC, Redmond, WA (US)

(*) Notice: Subject to any disclaimer, the term of this patent is extended or adjusted under 35 U.S.C. 154(b) by 987 days.

(21) Appl. No.: 13/345,130

(22) Filed: Jan. 6, 2012

(65) Prior Publication Data

US 2013/0176396 A1     Jul. 11, 2013

(51) Int. Cl.
   H04N 13/02      (2006.01)
   H04N 9/04       (2006.01)
   H01L 27/146     (2006.01)
   H04N 5/3745     (2011.01)

(52) U.S. Cl.
   CPC ............ *H04N 9/045* (2013.01); *H01L 27/1461* (2013.01); *H01L 27/1463* (2013.01); *H01L 27/14645* (2013.01); *H01L 27/14649* (2013.01); *H04N 13/0253* (2013.01); *H04N 5/3745* (2013.01); *H04N 13/0207* (2013.01)

(58) Field of Classification Search
   CPC .......... H04N 13/0239; H04N 13/0055; H04N 13/0296; H04N 13/0497; H04N 13/0242
   USPC .......................................................... 348/46
   See application file for complete search history.

(56) References Cited

U.S. PATENT DOCUMENTS

| 6,198,147 | B1 | 3/2001 | Connolly |
| 6,324,296 | B1 | 11/2001 | McSheery et al. |
| 6,704,050 | B1 * | 3/2004 | Washkurak et al. .......... 348/294 |
| 7,154,157 | B2 | 12/2006 | Bradski et al. |
| 7,224,384 | B1 | 5/2007 | Iddan et al. |
| 7,495,369 | B2 | 2/2009 | Yacoubian |
| 7,915,652 | B2 | 3/2011 | Lee et al. |
| 8,773,352 | B1 * | 7/2014 | Huang .......................... 345/156 |
| 2004/0012698 | A1 | 1/2004 | Suda et al. |
| 2006/0044427 | A1 | 3/2006 | Hu |
| 2007/0298533 | A1 | 12/2007 | Yang et al. |

(Continued)

FOREIGN PATENT DOCUMENTS

CN    1377181 A      10/2002
EP    2117047 A1     11/2009

OTHER PUBLICATIONS

International Search Report and Written Opinion of the International Searching Authority dated Apr. 29, 2013, PCT Application No. PCT/US2013/020182, filed Jan. 3, 2013, 8 pages.
"First Office Action and Search Report Issued in Chinese Patent Application No. 201310002216.7", Mailed Date: Mar. 13, 2015, 12 Pages.
"Search Report Issued in European Patent Application No. 13733569.1", Mailed Date: Jul. 3, 2015, 3 Pages.

(Continued)

*Primary Examiner* — William C Vaughn, Jr.
*Assistant Examiner* — Daniel Tekle
(74) *Attorney, Agent, or Firm* — Gregg Wisdom; Judy Yee; Micky Minhas

(57) ABSTRACT

A broadband imager, which is able to image both IR and visible light, is disclosed. In one embodiment, an IR sensitive region of an IR pixel underlies the R, G, B sensitive regions of R, G, and B visible pixels. Therefore, the IR pixel receives IR light through a same surface area of the photosensor through which the R, G, and B pixels receive visible light. However, the IR light generates electron-hole pairs deeper below the common surface area shared by the RGB and IR pixels, than visible light. The photosensor also has a charge accumulation region for accumulating charges generated in the IR sensitive region and an electrode above the charge accumulation region for providing a voltage to accumulate the charges generated in the IR pixel.

20 Claims, 12 Drawing Sheets

(56) References Cited

U.S. PATENT DOCUMENTS

| | | |
|---|---|---|
| 2008/0315104 A1 | 12/2008 | Nam |
| 2010/0102366 A1 | 4/2010 | Lee et al. |
| 2010/0117126 A1 | 5/2010 | Takahashi |
| 2010/0289885 A1 | 11/2010 | Lu et al. |
| 2013/0229540 A1* | 9/2013 | Farina et al. ............... 348/218.1 |

OTHER PUBLICATIONS

Response to Office Action dated Jul. 16, 2015, Chinese Patent Application No. 2013100022167.

English translation of claims amendment filed in Response to Office Action dated Jul. 16, 2015, Chinese Patent Application No. 2013100022167.

* cited by examiner

BROADBAND IMAGER

BACKGROUND

Some cameras, conventionally referred to as three-dimensional (3D) cameras, image a scene to determine distances to features in the scene. Such cameras may use infrared (IR) light to image the scene. For example, a gated time of flight (TOF) 3D camera, may transmit a train of IR light pulses to illuminate a scene and shutter or "gate on" a photosensor in the camera for a short exposure period following each transmitted light pulse. Light reflected from the transmitted light pulses that reaches the photosensor during the exposure periods is registered by pixels in the photosensor. Distance to a feature in the scene imaged on a pixel of the photosensor is determined as a function of an amount of reflected light incident on the pixel during the exposure periods.

To identify distances to features in the scene with the features, it is generally advantageous to acquire a conventional contrast image ("picture image") of the scene with visible light incident on pixels of a photosurface that are in known correspondence with pixels of the photosensor that provides the IR image of the scene. In some TOF 3D cameras, the IR and visible light images of a scene are acquired by two separate photosensors that are aligned so that corresponding pixels in the two photosensors image the same feature of the scene In some TOF 3D cameras, the IR image is acquired by IR sensitive pixels in a photosensor on which a scene is imaged and the visible light picture is acquired by different, optionally red (R), green (G), and blue (B) sensitive pixels in the same photosensor.

SUMMARY

Technology is provided for a broadband imager, which is able to image both IR and visible light. In one embodiment, an IR sensitive region of an IR pixel underlies the R, G, B sensitive regions of R, G, and B visible pixels. Therefore, the IR pixel receives IR light through a same surface area of the photosensor through which the R, G, and B pixels receive visible light. Therefore, less surface area is needed for the combination of an IR photosensor and an RGB photosensor, which may reduce cost. This also provides for easier and better correlation between an IR image and an RGB image.

One embodiment includes a semiconductor photosensor that has an IR sensitive region below a visible light sensitive region. The semiconductor photosensor has at least one visible light pixel having at least one region in a substrate that is sensitive to visible light. Also, the photosensor has an infrared (IR) pixel having a region in the substrate that is sensitive to IR light. The IR sensitive region is below the at least one visible light sensitive region. The photosensor also has a charge accumulation region for accumulating charges generated in the IR sensitive region and an electrode above the charge accumulation region for providing a voltage to accumulate the charges generated in the IR sensitive region.

One embodiment includes a method of operating a semiconductor photosensor that has an IR sensitive region below a visible light sensitive region. The method includes providing a signal to a photogate above a first charge accumulation region to accumulate charges generated in an IR sensitive region that is below at least one visible light sensitive region. A signal is provided to a first transfer gate to cause charges to transfer from the first charge accumulation region to an IR light sensing node. A signal is provided to a second transfer gate to cause charges to transfer from a second charge collection region in the at least one visible light pixel to a visible light sensing node for a first visible light pixel. The IR light sensing node and the visible light sensing node are read.

One embodiment includes a 3D depth camera that has a semiconductor photosensor array comprising visible light pixels and infra-red (IR) pixels. Each of the visible light pixels has a photodiode. Each of the infra-red (IR) pixels has an IR sensitive region below at least a portion of one at least one of the photodiodes. The array has a charge accumulation region associated with each of the IR pixels. The charge accumulation region is for accumulating charges generated in the associated IR sensitive region. The array has p-well regions between the charge accumulation regions and the photodiodes. A photogate is associated with each of the charge accumulation regions. The photogate is above the charge accumulation region to provide a voltage to accumulate the charges generated in the associated IR sensitive region into the charge accumulation region.

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

BRIEF DESCRIPTION OF THE DRAWINGS

The technology in accordance with this specification is further described with reference to the accompanying drawings.

DETAILED DESCRIPTION

Technology is provided for a broadband imager (e.g., photosensor), which is able to image both IR and visible light. Note that the IR could be any part of the IR spectrum (near, mid, or far). In one embodiment, the broadband imager senses near IR. In one embodiment, an IR sensitive region of an IR pixel underlies the R, G, B sensitive regions of R, G, and B visible pixels. Therefore, the IR pixel receives IR light through a same surface area of the photosensor through which the R, G, and B pixels receive visible light. Therefore, less surface area is needed for the combination of an IR photosensor and an RGB photosensor, which may reduce cost. The pixels of the photosensor may be configured in a pattern that maximizes the surface area used to sense visible light while still allowing for IR light to be sensed and read out.

Figure 1:
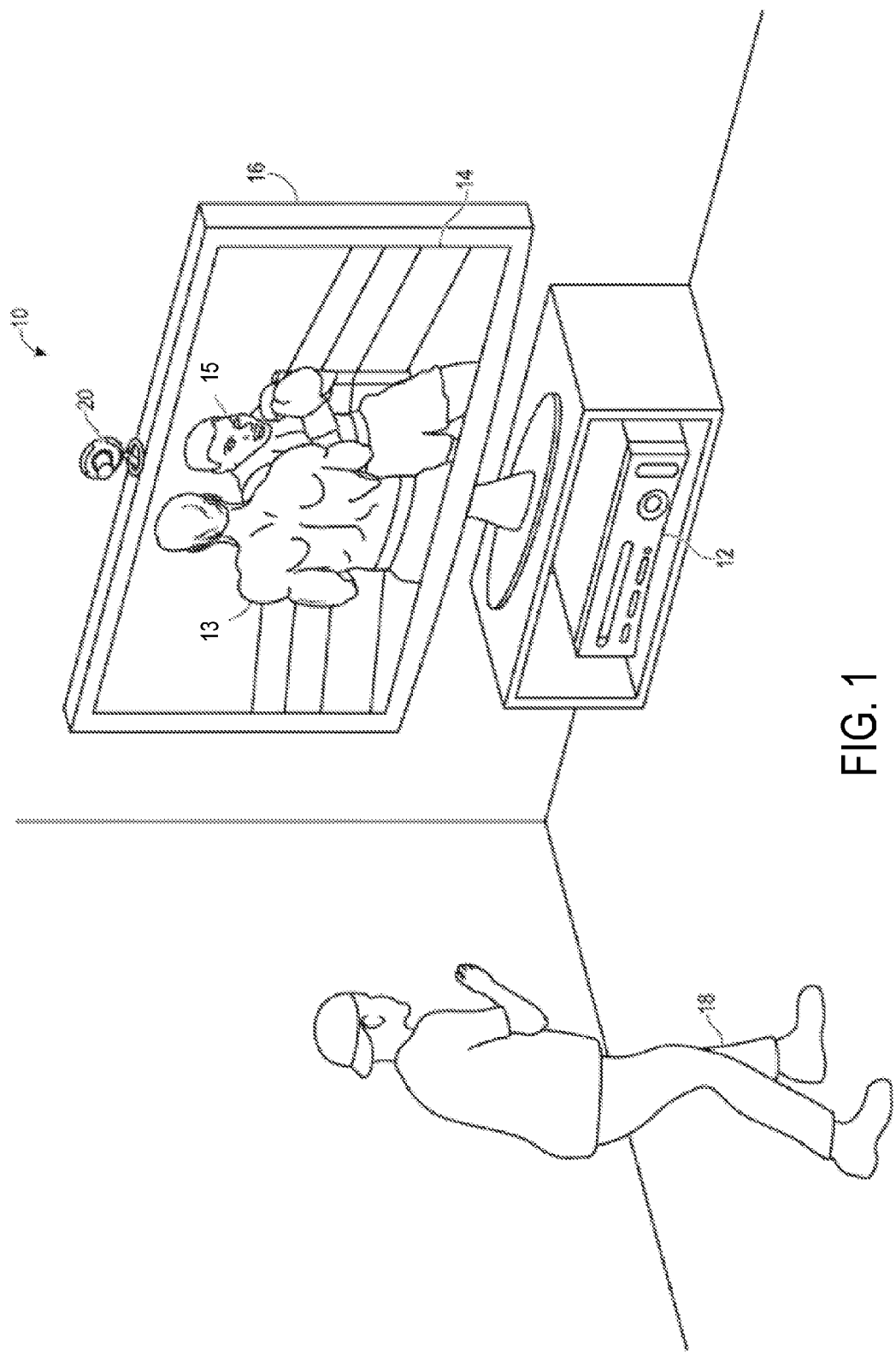
FIG. 1 illustrates an example embodiment of a target recognition, analysis, and tracking system in which embodiments of the technology can operate.

Tracking moving targets in 3D is one possible application of a broadband imager. FIG. 1 provides a contextual example in which the present technology can be useful. FIG. 1 illustrates an example embodiment of a target recognition, analysis, and tracking system 10 in which embodiments of a broadband imager can operate. The target recognition, analysis, and tracking system 10 may be used to recognize, analyze, and/or track a human target such as the user 18. Embodiments of the target recognition, analysis, and tracking system 10 include a computing environment 12 for executing a gaming or other application, and an audiovisual device 16 for providing audio and visual representations from the gaming or other application. The system 10 further includes a capture device 20 for capturing positions and movements performed by the user in 3D, which the computing environment 12 receives, interprets and uses to control the gaming or other application.

In an example embodiment, the application executing on the computing environment 12 may be a game with real time interaction such as a boxing game that the user 18 may be playing. For example, the computing environment 12 may use the audiovisual device 16 to provide a visual representation of a boxing opponent 15 to the user 18. The computing environment 12 may also use the audiovisual device 16 to provide a visual representation of a player avatar 13 that the user 18 may control with his or her movements. For example, the user 18 may throw a punch in physical space to cause the player avatar 13 to throw a punch in game space. Thus, according to an example embodiment, the capture device 20 captures a 3D representation of the punch in physical space using the technology described herein. A processor (see FIG. 2) in the capture device and the computing environment 12 of the target recognition, analysis, and tracking system 10 may be used to recognize and analyze the punch of the user 18 in physical space such that the punch may be interpreted as a gesture or game control of the player avatar 13 in game space and in real time.

Figure 2:
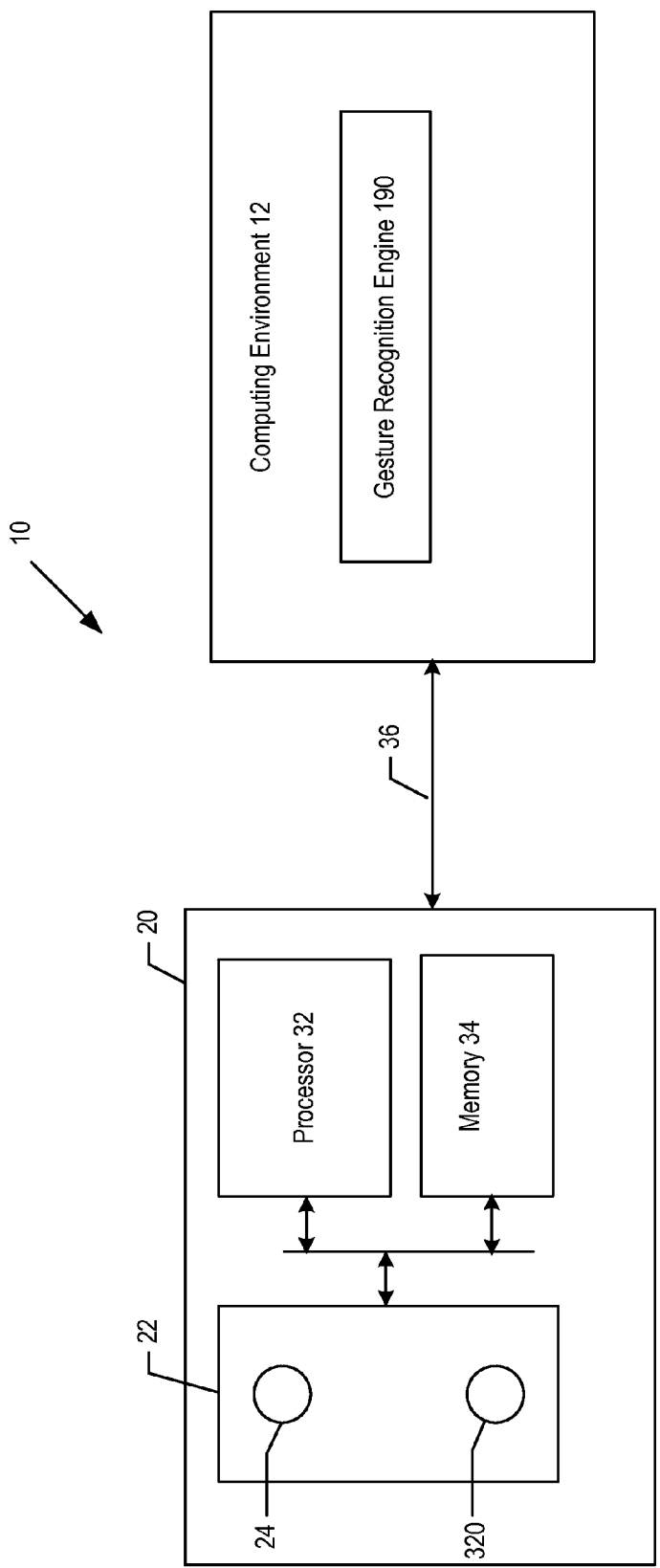
FIG. 2 shows a block diagram of an example of a capture device that may be used in the target recognition, analysis, and tracking system in which embodiments of the technology can operate.

FIG. 2 illustrates a block diagram view of an example of a capture device 20 that may be used in the target recognition, analysis, and tracking system 10. In an example embodiment, the capture device 20 may be configured to capture video having a depth image that may include depth values via any suitable technique including, for example, time-of-flight, structured light, stereo image, or the like. According to one embodiment, the capture device 20 may organize the calculated depth information into "Z layers," or layers that are perpendicular to a Z axis extending from the depth camera along its optic axis.

As shown in FIG. 2, according to an example embodiment, the image capture device 20 comprises an image camera component 22 which may include an IR light component 24 and a photosensor 320 that is able to image both IR and RGB. The IR light component 24 may emit infrared light pulses onto the scene. The photosensor 320 may be used to obtain a depth image of a scene. For example, the RGB pixels in the photosensor 320 may capture a contrast image. In time-of-flight analysis, the IR light component 24 of the capture device 20 may emit infrared light pulses onto the scene and may then use IR sensors on a photosurface of photosensor 320 to detect the backscattered light from the surface of one or more targets and objects in the scene to obtain a depth image.

In an example embodiment, the capture device 20 may further include a processor 32 that may be in operative communication with the image camera component 22. The processor 32 may include a standardized processor, a specialized processor, a microprocessor, or the like that may execute instructions for receiving the depth image, determining whether a suitable target may be included in the depth image, converting the image of the suitable target into a skeletal representation or model of the target, or any other suitable instruction.

The capture device 20 may further include a memory component 34 that may store the instructions that may be executed by the processor 32, images or frames of images captured by the photosensor 320, or any other suitable information, images, or the like. According to an example embodiment, the memory component 34 may include random access memory (RAM), read only memory (ROM), cache, Flash memory, a hard disk, or any other suitable storage component. As shown in FIG. 2, in one embodiment, the memory component 34 may be a separate component in communication with the image camera component 22 and the processor 32. According to another embodiment, the memory component 34 may be integrated into the processor 32 and/or the image camera component 22.

As shown in FIG. 2, the capture device 20 may communicate with the computing environment 12 via a communication link 36. The communication link 36 may be a wired connection including, for example, a USB connection, a Firewire connection, an Ethernet cable connection, or the like and/or a wireless connection such as a wireless 802.11b, g, a, or n connection.

Additionally, the capture device 20 may provide the depth information and images captured by, for example, the photosensor 320, and a skeletal model that may be generated by the capture device 20 to the computing environment 12 via the communication link 36. A variety of known techniques exist for determining whether a target or object detected by capture device 20 corresponds to a human target. Skeletal mapping techniques may then be used to determine various body parts on that user's skeleton. Other techniques include transforming the image into a body model representation of the person and transforming the image into a mesh model representation of the person.

The skeletal model may then be provided to the computing environment 12 such that the computing environment may track the skeletal model and render an avatar associated with the skeletal model. Under the control of gesture recognition engine software 190, the computing environment 12 may further determine which controls to perform in an application executing on the computer environment based on, for example, gestures of the user that have been recognized from three dimensional movement of parts of the skeletal model.

Figure 3:
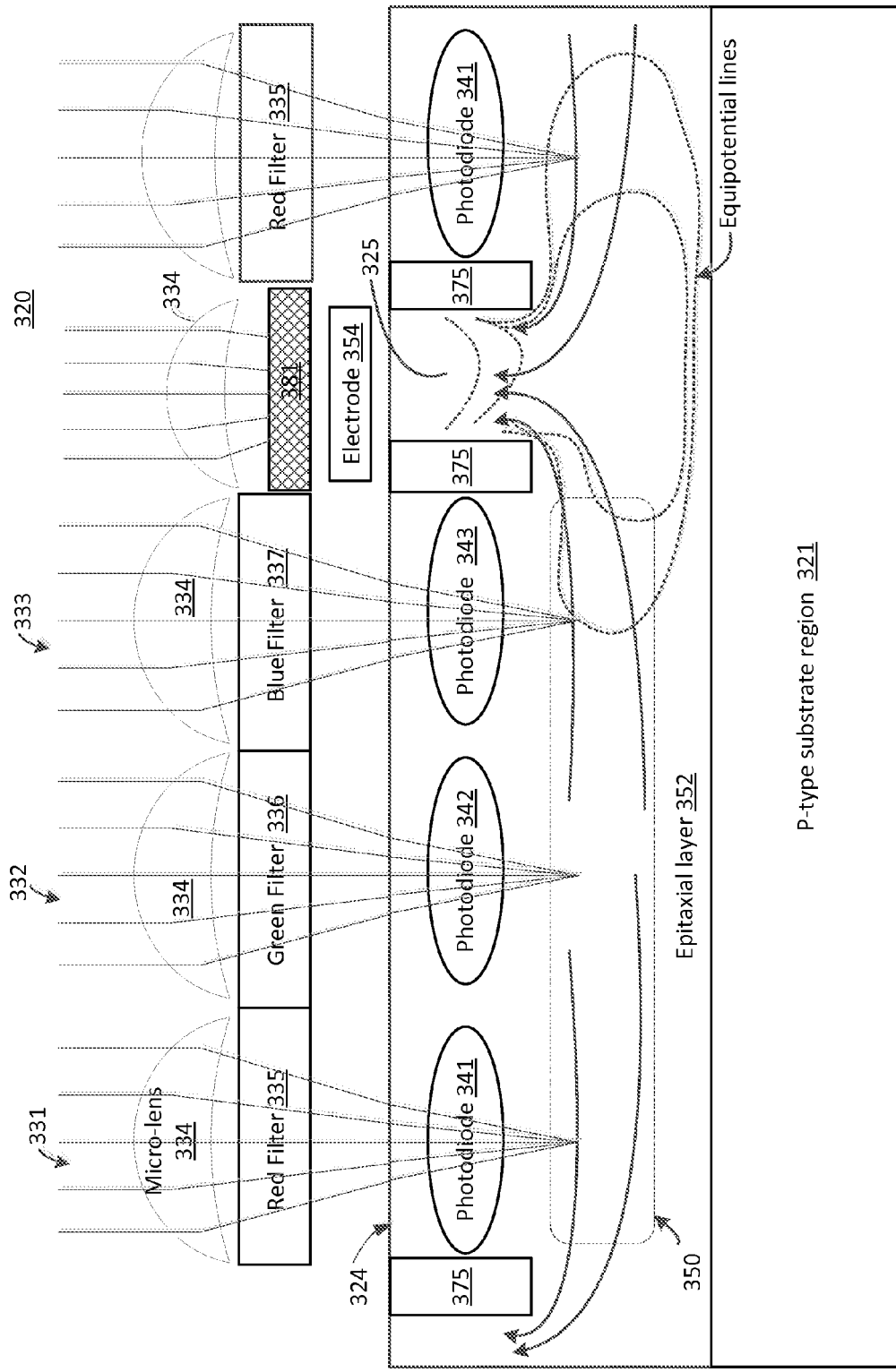
FIG. 3 is a schematic diagram of one embodiment of a portion of a photosensor.

FIG. 3 is a schematic diagram of one embodiment of a portion of a photosensor. Some details have been omitted to simplify explanation. The portion of photosensor 320 shown in FIG. 3 comprises a silicon (Si) substrate 322 having a p-type substrate region 321 and an epitaxial layer 352. Microlenses 334, filters 335, 336, 337, an optical shield 381, and an electrode 354 are over the surface 324 of the substrate 322.

The portion of the photosensor 320 has two red pixels 331, a green pixel 332 and a blue pixel 333. The RGB pixels comprise microlenses 334 that direct light to pass through red filter 335, green filter 336, and blue filter 337, respectively. The filtered light is transmitted into substrate 322 through a surface region 324. The lenses 334 and filters 335, 336 and 337 also transmit IR light in a desired band of IR light. As noted above, the IR light may be any portion of the IR spectrum. In one embodiment, the filter passes near IR light but blocks other IR light. R, G and B light that passes through filters 335, 336 and 337, generates electron-hole pairs in photodiode regions 341, 342 and 343 respectively of substrate 322. Note that the physical arrangement of RGB pixels is presented for convenience of explanation. Other physical arrangements may be used.

IR light passes through lenses 334 and filters 335, 336, and 337 as well, and generates electron-hole pairs in a region 350 of photosensor 320. Region 350 is deeper below the surface 324 than are photodiodes 341, 342, 343 because IR light has a longer absorption length in silicon than visible light. Region 350 and lenses 334 are components of an IR pixel that shares surface 324 with RGB pixels 331, 332 and 333.

During operation, a high voltage may be applied to electrode 354 to create a potential well in IR charge accumulation region 325 of the substrate 322. The electrode 354 may also be referred to herein as a "photogate." Example equipotential lines that results from the high voltage are depicted. A p-well 375 surrounds the IR charge accumulation region 325, in one embodiment. The p-well 375 may be located between the IR charge accumulation region 325 and one or more photodiodes 341-343, and may provide electrical isolation. Electrons from the electron-hole pairs formed in region 350 may be attracted to and accumulate in the potential well 325 (arrows show direction of flow of electrons). The accumulated electrons may be converted by a suitable amplifier (not shown in FIG. 3) to a voltage that represents an amount of electron-hole pairs formed in region 350 and therefore an amount of IR light incident on surface 324 and thereby IR pixel.

Above the electrode 354 is an optical shield 381, which may block at least visible and IR light. In one embodiment, the optical shield 381 is aluminum covered with TiN. The microlens 334 that is above the optical shield 381 is optional. In one embodiment, including the microlens 334 above the optical shield 381 simplifies manufacturing.

Amplifiers (not depicted in FIG. 3) convert charge accumulated in photodiode regions 341, 342, and 343 to voltages that represent amounts of R, G and B light incident on pixels 331, 332 and 333. In one embodiment, the p-well(s) 375 may prevent charges accumulated in photodiode regions 341, 342, and 343 from being drawn into the potential well 325.

In one embodiment, p-type substrate region 321 is p+ silicon. An epitaxial layer 352 is formed over region 321 in one embodiment. The epitaxial layer 352 may be p− silicon. As one example, the epitaxial layer 352 may be doped with Boron with a concentration of $1.0 \times 10^{15}$ cm$^3$. The p-wells 375 may have a doping concentration of $2.0 \times 10^{17}$ cm$^3$ of p-type dopant such as Boron. Note that the IR charge accumulation region 325 may have the same doping concentration and type as the epitaxial layer 352; however, the same doping concentration is not required.

The photodiode regions 341, 342, 343 may be n-type with a dopant such as phosphorous. An example doping concentration is $2.0 \times 10^{16}$ cm$^3$. In one embodiment, there is a pinning layer (not depicted in FIG. 3) above the photodiodes 341, 342, 343. An example doping concentration for the pinning layer is $1.0 \times 10^{18}$ cm$^3$ of a p-type dopant, such as Boron. All doping concentrations described herein may be higher or lower. Other dopants may be used for both n-type and p-type dopants.

Figure 4:
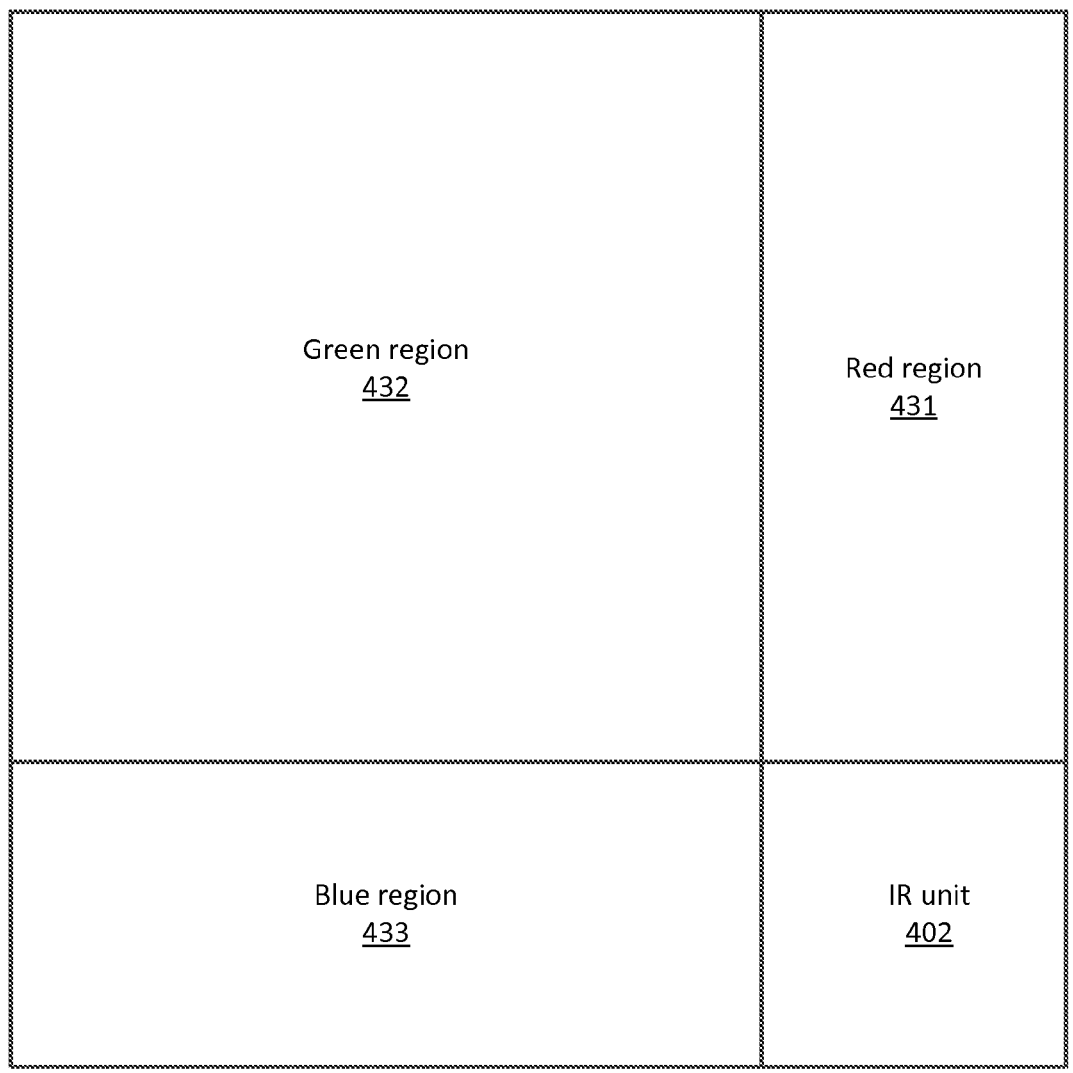
FIG. 4 shows a top schematic view of an RGB-IR unit cell of one embodiment of a photosensor.

FIG. 4 shows a top schematic view of and RGB-IR unit cell of one embodiment of a photosensor array. The IR unit 402 corresponds to the region having a p-well 375 and IR collection region 325, in one embodiment. Note that the area covered by the IR unit 402 may include other elements, such as a transfer gate and transistors (see FIG. 6, for example). The area associated with each of the RGB regions 431, 432, 433 may include at least a microlens 334 and one of the filters 335-337. However, the area associated with RGB regions 431, 432, 433 may also include elements such as a transfer gate and transistors (see FIG. 7, for example). Note that that pattern used in the embodiment of FIG. 4 does not correspond to the pattern used in the embodiment of FIG. 3.

Also note that the IR unit 402 is relatively small compared to the RGB regions 431, 432, 433. Referring back to the embodiment of FIG. 3, light is prevented from entering the IR collection region 325 and p-well 375. Therefore, there is no light to generate charges are in those areas, in one embodiment. However, by keeping the IR unit 402 relatively small, the RGB collection area is maximized. Also note that the IR unit 402 does not need a large lateral surface area to be effective at collecting the electrons from region 350.

Figure 5:
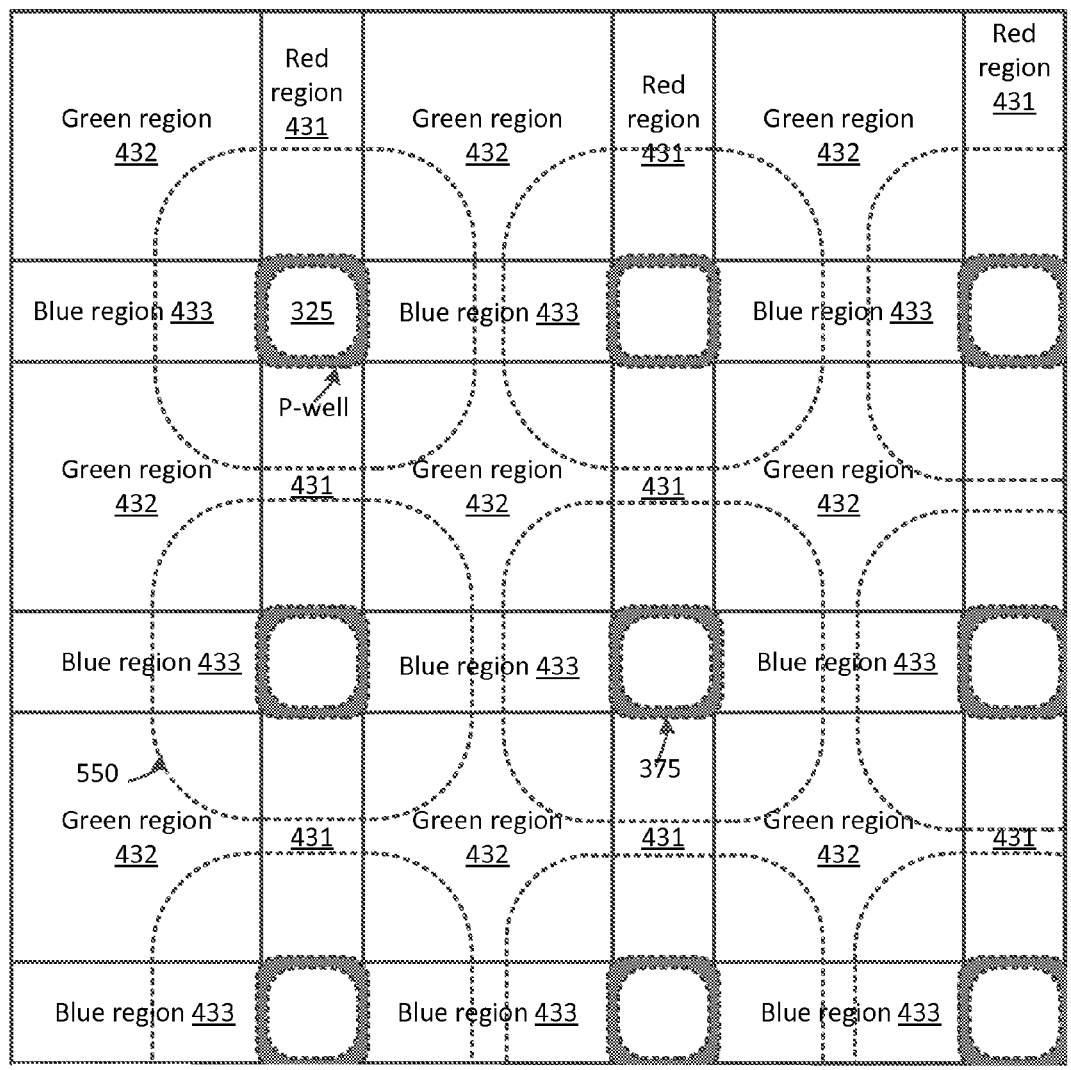
FIG. 5 shows an array of RGB-IR unit cells, which may form part of one embodiment of a semiconductor photosensor array.

FIG. 5 shows an array of RGB-IR unit cells, which may form part of a semiconductor photosensor array, in one embodiment. As previously discussed, the IR sensitive region 350 resides under photodiodes 341-343, in one embodiment. As previously discussed, IR collection region 325 attracts electrons from IR sensitive region 350 during operation. Region 550 shows a region over which charges may be collected for a given IR collection region 325 due to the field induced by the electrode (or photogate) 354, in one embodiment. As noted, a p-well 375 in the substrate 322 may surround the IR collection region 325 to provide isolation from the photodiodes 341-343. Thus, any charges generated from the photodiodes 341-343 are not drawn to the IR collection region 325. However, charges (e.g., electrons) generated in the IR sensitive region 350 are able to be drawn under the p-well 375 to the IR collection region 325. Note that there may be p-wells associated with the red 431, green 432, and blue 433 regions. For example, there may be a p-well for sensing the visible light pixel (see, for example, p-well 765 in FIG. 7). However, those p-wells are not depicted in FIG. 5 so as to not obscure the diagram. Also, the p-well 375 in the IR unit 402 may have a different shape than depicted in FIG. 5. Also, there may be more than one p-well in the IR unit 402.

Figure 6:
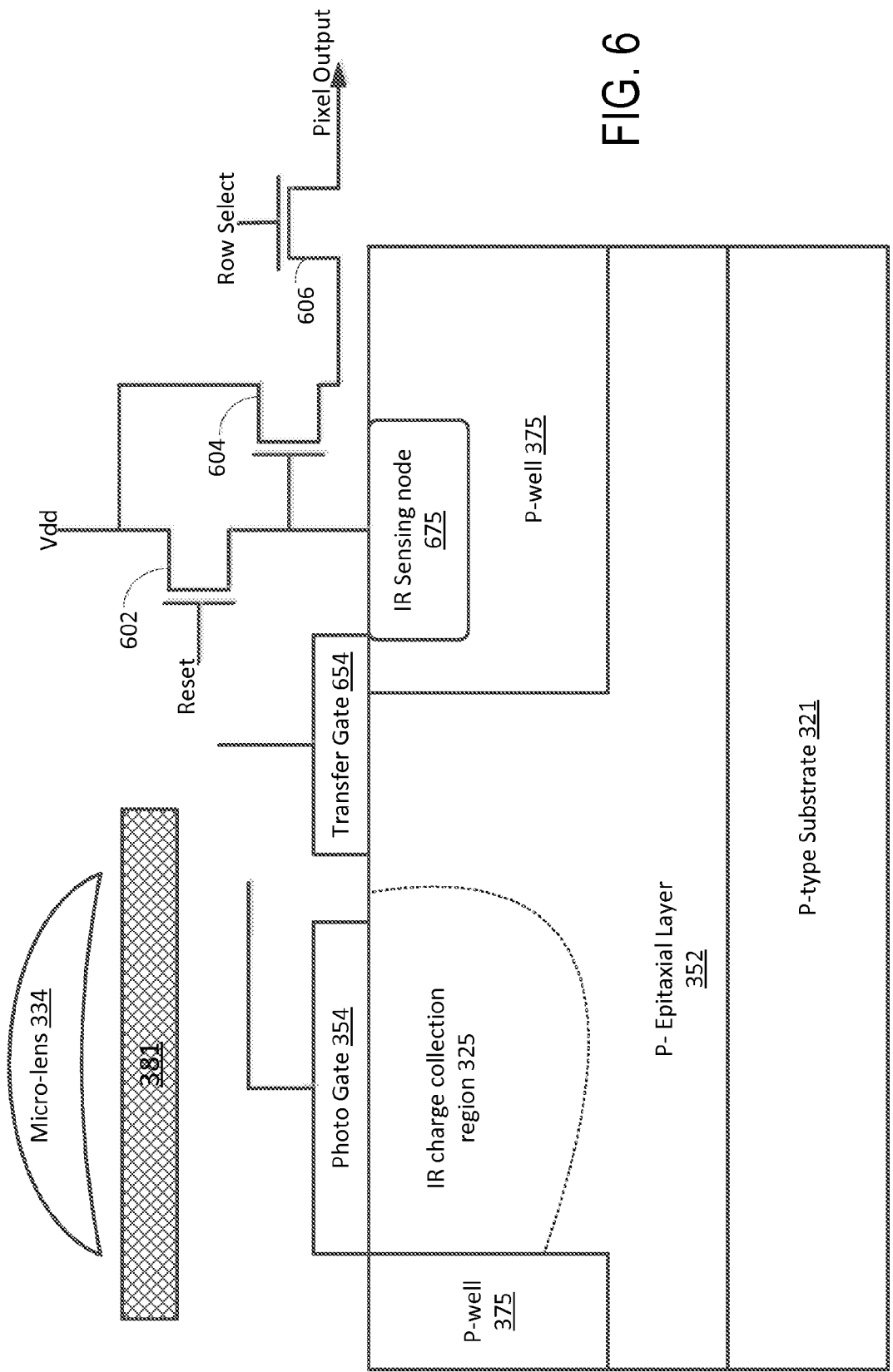
FIG. 6 is a diagram of one embodiment of an IR pixel.

FIG. 6 is a diagram of one embodiment of an IR pixel. This perspective shows various transistors used to control the IR pixel. An IR charge collection region 325 is shown as a region generally outlined below the photo gate 354. However, note that the IR charge collection region 325 does not necessarily have precisely defined borders. The two portions of the p-well 375 that are depicted in FIG. 6 may be part of a continuous p-well region that surrounds the IR collection region 325. For example, referring back to FIG. 5, one example is provided in which each p-well 375 provides isolation from RGB pixels. A positive voltage may be applied to the photogate (or electrode) 354 to form a potential well in the IR charge collection region 325 to attract charge carriers, as previously discussed. After turning off the photo gate 354, a pulse may be applied to the transfer gate 654 to cause charge carriers to move to the IR sensing node 675 in the p-well 375. There, the charge is converted to voltage, which is sensed and read out. Note that neither the photogate 354 nor the transfer gate 654 needs to be transparent to IR light.

The transistors include a reset transistor 602, a sense transistor 604, and a select transistor 606. A voltage Vdd may be applied to one terminal (e.g., drain) of reset transistor 602, and one terminal of the sense transistor 604. A reset signal may be applied to the gate of the reset transistor 602 to remove charge from the sensing node 675. The photogate 354 and transfer gate 654 may be operated in sequence as described above to re-charge the IR sensing node 675. Row select signal may be applied to the gate of select transistor 606 to read out the signal whose voltage is proportional to the charge stored at the IR sensing node 675.

Figure 7:
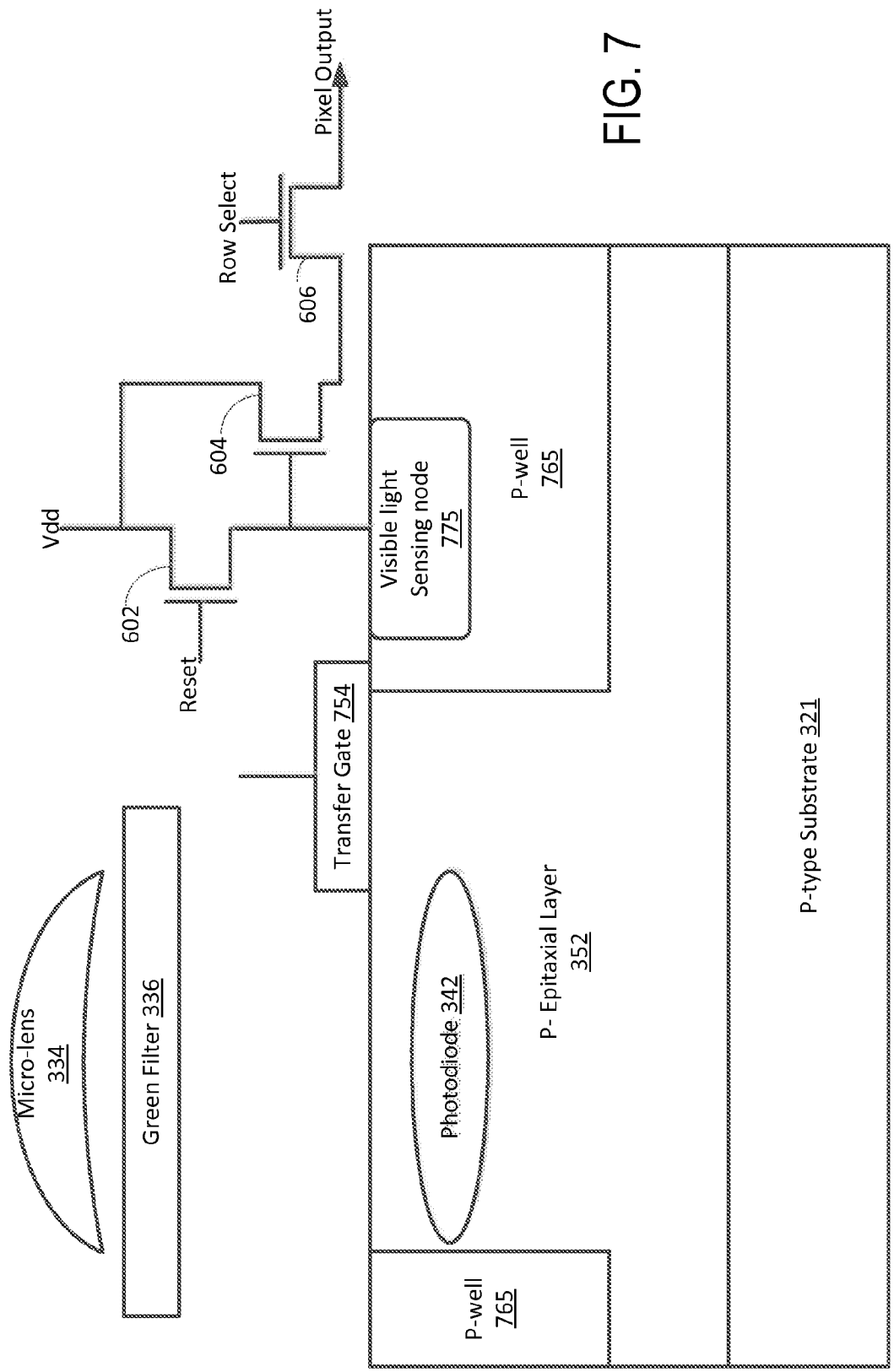
FIG. 7 is a diagram of one embodiment of a green pixel.

FIG. 7 is a diagram of one embodiment of a green pixel. Red and blue pixels may be similar, so are not depicted. This perspective shows various transistors used to control the green pixel. During operation, charge carries may be generated at photodiode 342 due to light, which should have a wavelength corresponding to green light due to green filter 336. A pulse may be applied to the transfer gate 754 to cause charge carriers to move to the visible light sensing node 775 in the p-well 765. There, the charge is converted to voltage, which is sensed and read out.

The transistors include a reset transistor 602, a sense transistor 604, and a select transistor 606. These may be similar to the ones used for the IR pixel. A voltage Vdd may be applied to one terminal (e.g., drain) of reset transistor 602, and one terminal of the sense transistor 604. A reset signal may be applied to the gate of the reset transistor 602 to remove charge from the visible light sensing node 775. Row select signal may be applied to the gate of select transistor 606 to read out the signal whose voltage is proportional to the charge stored at the visible light sensing node 775.

Figure 8:
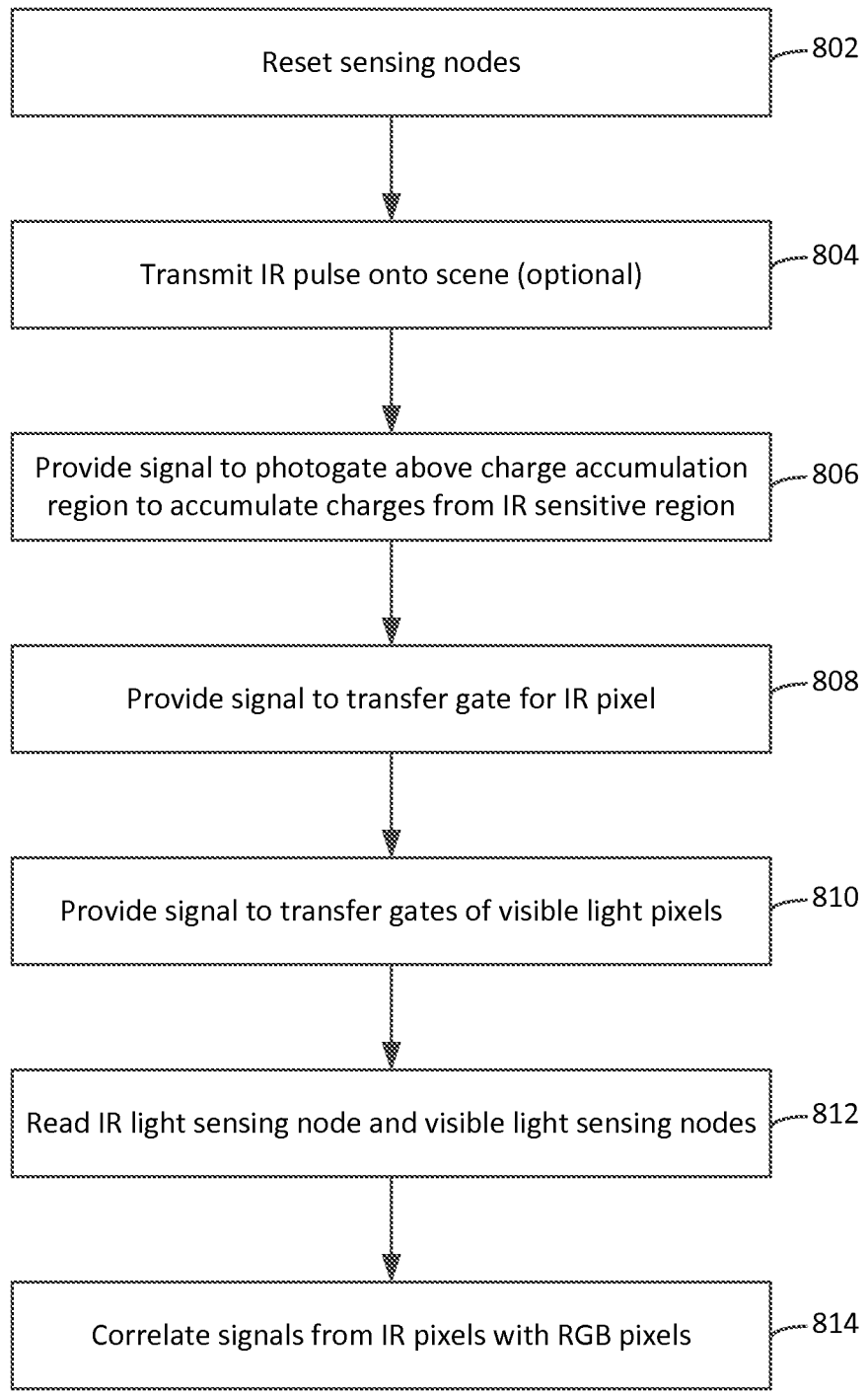
FIG. 8 is a flowchart of a process of operating a semiconductor photosensor.

FIG. 8 is a flowchart of a process of operating a semiconductor photosensor 320. The process may be used with any of the semiconductor photosensors 320 described herein, but it not limited to specific embodiments described herein. In step 802, IR and visible light sensing nodes (675, 775, respectively) are reset. In one embodiment, a reset signal is provided to reset transistors 602.

In optional step 804, a pulse of IR light is transmitted onto a scene that is being imaged by the semiconductor photosensor. In one embodiment, IR light transmitter (FIG. 2, 24) is used. This pulse may be one of a series of pulses that are used to help determine distance to features in the scene.

In step 806, a signal is provided to a photogate 354 associated with an IR pixel to accumulate charges in the charge accumulation region 325. This signal may be a voltage of sufficient magnitude to accumulate the charges. The signal may be of any suitable desired length. Note that step 806 may be performed on multiple IR pixels simultaneously.

In step 808, a signal is provided to transfer gate 654 associated with the IR pixel to cause the charges in the charge accumulation region 325 to migrate to the IR sensing node 675. In one embodiment, this is a short voltage pulse. Note that step 808 may be performed on multiple IR pixels simultaneously.

In step 810, a signal is provided to transfer gate 754 associated with a visible pixel to cause the charges in photodiodes (341, 342, 343) to migrate to the visible light sensing nodes 775. Note that step 808 may be performed on multiple visible pixels simultaneously.

In step 812, the IR sensing nodes 675 and the visible light sensing nodes 775 are read. In one embodiment, a row select signal is applied to the select transistors 606. In one embodiment, step 810 includes reading one row of pixels. Note that each row does not necessarily include IR pixel output. Step 812 may be repeated to read other rows.

In step 814, the signals read from the IR pixels are correlated to the signals read from the visible pixels. In one embodiment, an RGB image is formed and an IR image is formed. Based on the known physical locations of the IR sensitive regions 350 and the visible light sensitive regions 341-343, the IR image can be precisely correlated to the RBG image. In one embodiment, distances to features in a scene are determined. For example, a time-of-flight analysis may be performed based on the IR image to determine depth to features in the RGB image. In one embodiment, a train of IR pulses are transmitted onto the scene and the photosensor is gated for a short exposure period following each of the IR pulses. Distance may be determined based on intensity of reflected IR light that is collected at the IR pixels.

Figure 9:
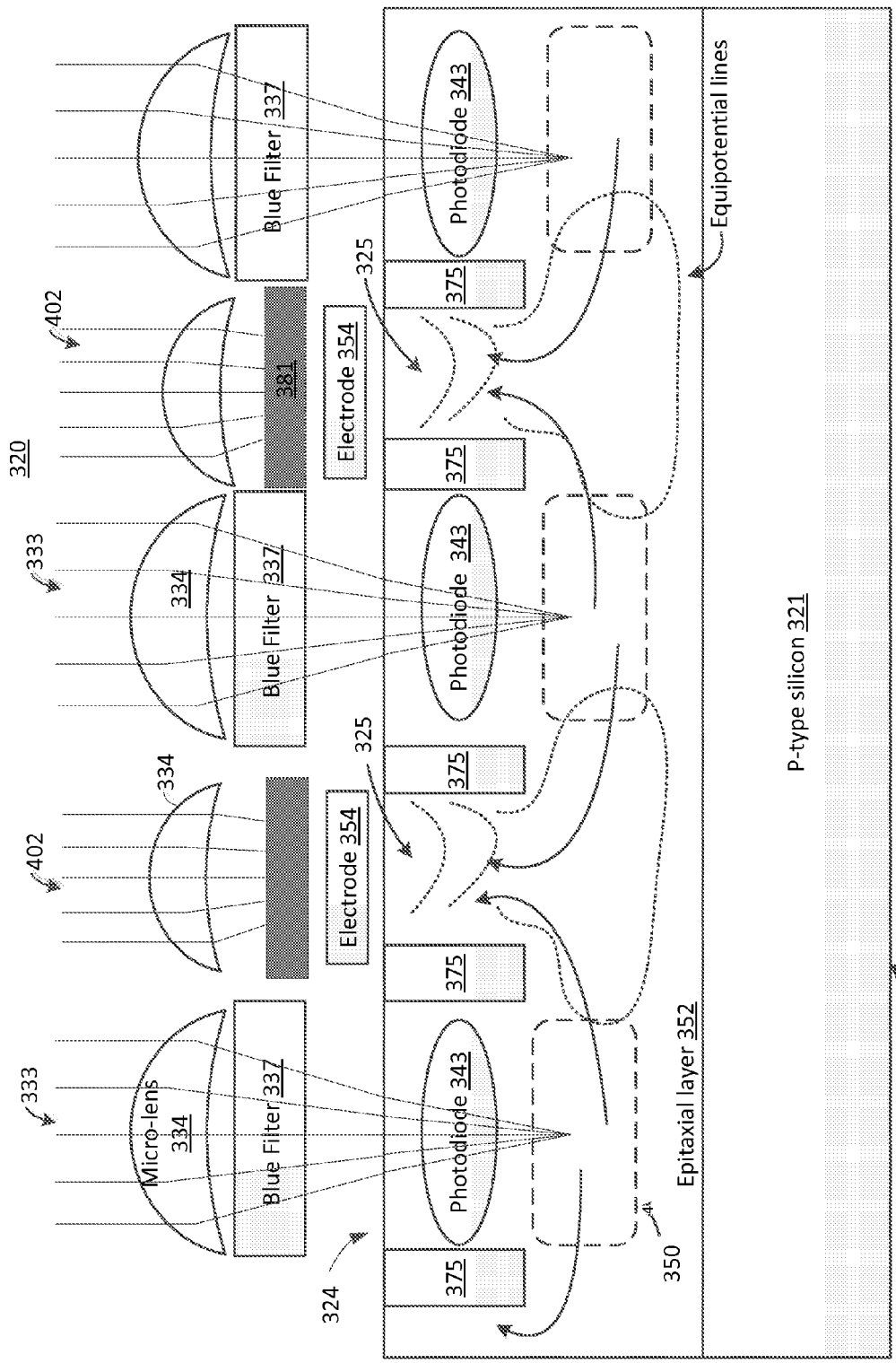
FIG. 9 is a schematic diagram of one embodiment of a portion of a photosensor showing blue pixels with IR sensitive regions below.

FIG. 9 shows one embodiment of a portion of a photosensor array. This embodiment shows a cross sectional view along a row from the embodiment of FIG. 5. This view shows alternating blue pixels 333 with IR units 402. Operation may be similar to the embodiment depicted in FIG. 3. Therefore, FIG. 9 will not be discussed in great detail. There is an IR sensitive region 350 below the photodiode 343 for the blue pixel. The p-wells 375 provide electrical isolation between the IR charge accumulation regions 325 and the photodiodes 343. In this embodiment, electrons from a given IR sensitive region 350 below one photodiode 343 are drawn to two separate IR charge accumulation regions.

Figure 10:
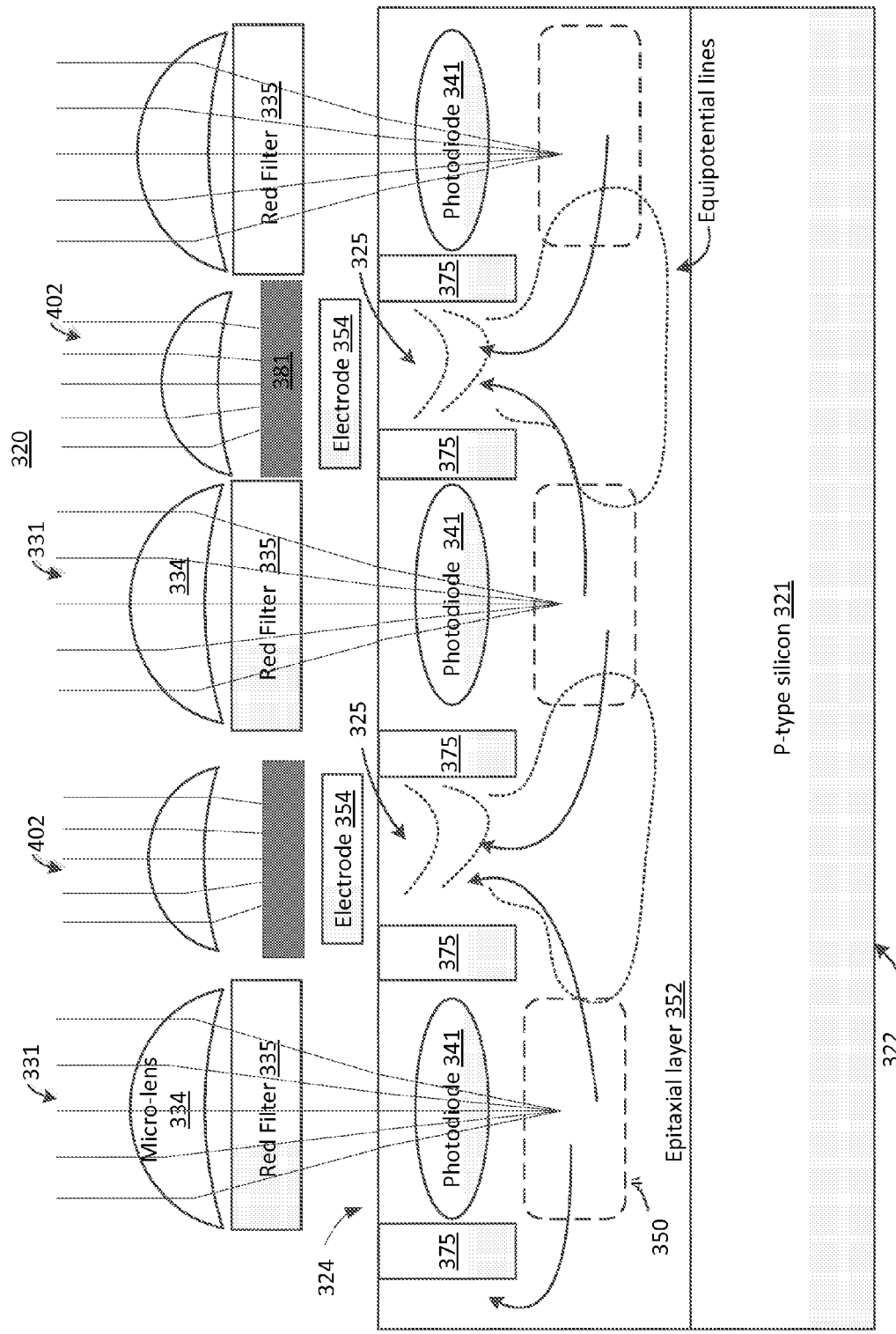
FIG. 10 is a schematic diagram of one embodiment of a portion of a photosensor showing red pixels with IR sensitive regions below.

FIG. 10 shows one embodiment of a portion of a photosensor array 320. This embodiment shows a cross sectional view along a column from the embodiment of FIG. 5. This view shows alternating red pixels 331 with IR units 402. Operation may be similar to the embodiment depicted in FIG. 3. Therefore, FIG. 10 will not be discussed in great detail. There is an IR sensitive region 350 below the photodiode 341 for the red pixel. The p-wells 375 provide electrical isolation between the IR charge accumulation regions 325 and the photodiode 341. In this embodiment, electrons from a given IR sensitive region 350 below one photodiode 341 are drawn to two separate IR charge accumulation regions 325.

Figure 11:
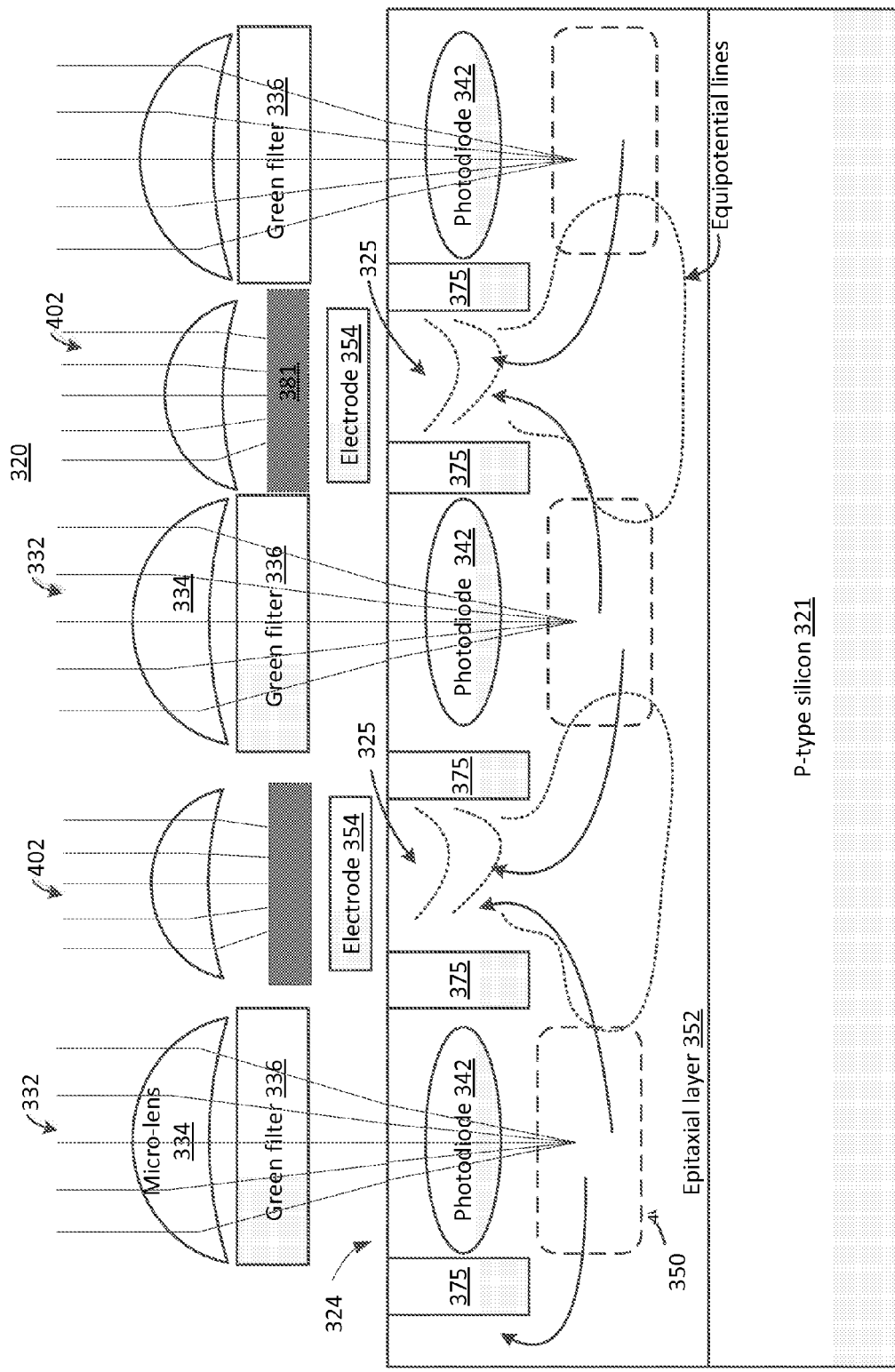
FIG. 11 is a schematic diagram of one embodiment of a portion of a photosensor showing green pixels with IR sensitive regions below.

FIG. 11 shows one embodiment of a portion of a photosensor array 320. This embodiment shows a cross sectional view along a diagonal from the embodiment of FIG. 5. This view shows alternating green pixels 332 with IR units 402. Operation may be similar to the embodiment depicted in FIG. 3. Therefore, FIG. 11 will not be discussed in great detail. There is an IR sensitive region 350 below the photodiode 342 for the green pixel. The p-wells 375 provide electrical isolation between the IR charge accumulation regions 325 and the photodiode 342. In this embodiment, electrons from a given IR sensitive region 350 below one photodiode 342 are drawn to two separate IR charge accumulation regions 325.

Note that FIG. 9-11 are simplified diagrams that do not depict transfer gates (e.g., 654, 754), sensing nodes (e.g., 675, 775), or transistors (e.g., 602, 604, 606) for either the IR pixels or for the RGB pixels. FIGS. 6 and 7 depict such elements for an IR pixel and visible light pixel, respectively. In various embodiments, the cross section of an IR pixel may resemble the embodiment of FIG. 6. Thus, the cross section of the IR pixel in any of the embodiments of any of FIGS. 9-11 may be modified to include an IR sensing node 675, transfer gate 654, and transistors, as depicted in FIG. 6. Likewise, the cross section of the visible pixel in any of the embodiments of any of FIGS. 9-11 may be modified to include a visible light sensing node 775, transfer gate 754, and transistors, as depicted in FIG. 7. In some embodiments, either the IR pixel or the visible light pixel is modified as described. In some embodiments, both the IR pixel of the visible light pixel is modified as described.

Note that a broadband imager (e.g., photosensor 320) is not limited to the various physical arrangements of pixels disclosed herein. Other patterns may be used. For example, rows could be switched with columns referring to the pattern of FIG. 5 (e.g., red and blue regions switched). If desired, rather than having different sizes for the various regions 431, 432, 433, 402, as depicted in FIGS. 4-5, the regions could each be about the same size. However, this may result in the green collection region being about the same size as the red and blue.

The example computer systems illustrated in the figures include examples of computer readable storage media. Computer readable storage media are also processor readable storage media. Such media may include volatile and nonvolatile, removable and non-removable media implemented in any method or technology for storage of information such as computer readable instructions, data structures, program modules or other data. Computer storage media includes, but is not limited to, RAM, ROM, EEPROM, cache, flash memory or other memory technology, CD-ROM, digital versatile disks (DVD) or other optical disk storage, memory sticks or cards, magnetic cassettes, magnetic tape, a media drive, a hard disk, magnetic disk storage or other magnetic storage devices, or any other medium which can be used to store the desired information and which can accessed by a computer.

Figure 12:
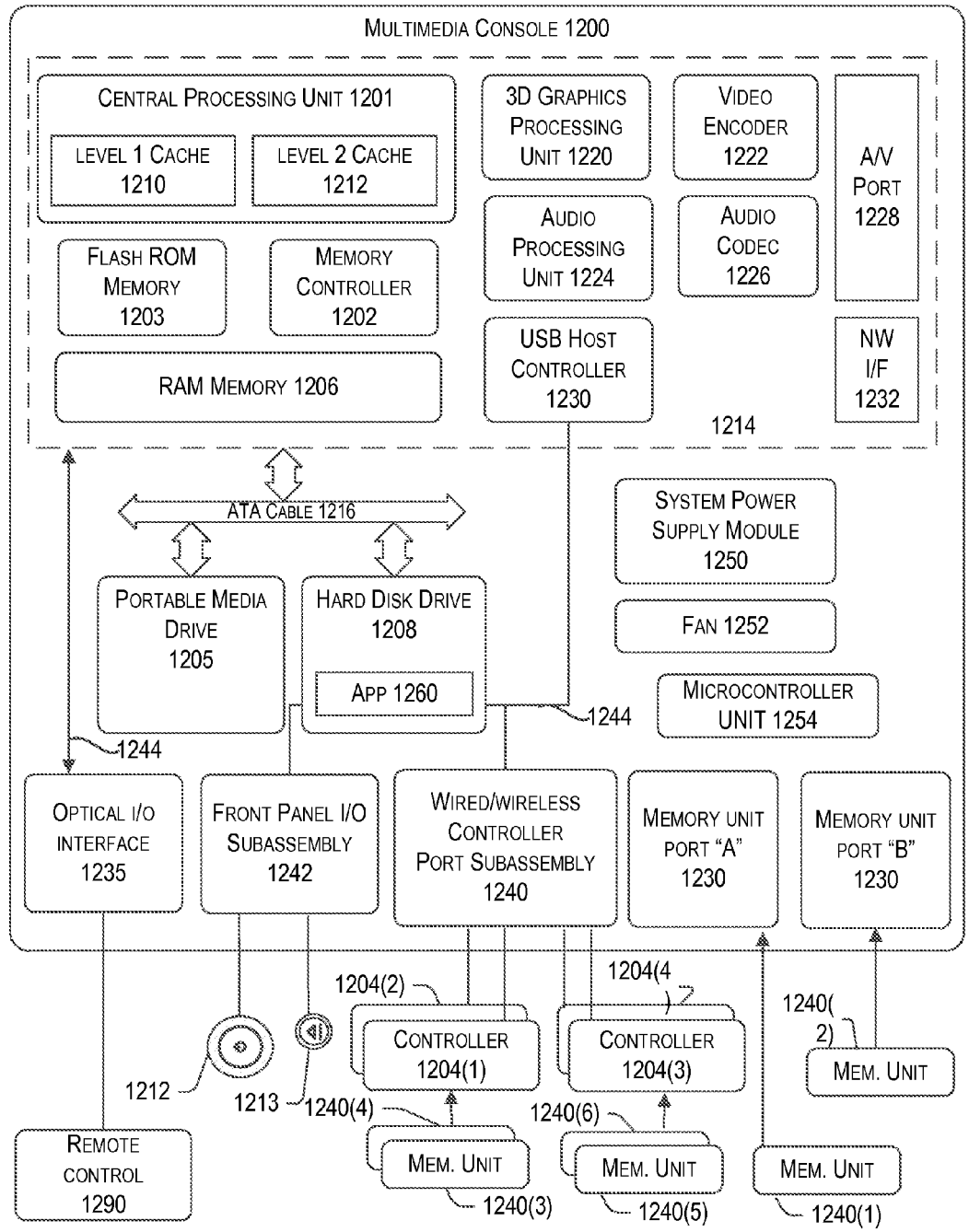
FIG. 12 is a block diagram of one embodiment of a computing system that can be used to implement embodiments.

FIG. 12 is a block diagram of one embodiment of a computing system that can be used to implement the hub computing system of FIGS. 1 and 2. In this embodiment, the computing system is a multimedia console 1200, such as a gaming console. As shown in FIG. 12, the multimedia console 1200 has a central processing unit (CPU) 1201, and a memory controller 1202 that facilitates processor access to various types of memory, including a flash Read Only Memory (ROM) 1203, a Random Access Memory (RAM) 1206, a hard disk drive 1208, and portable media drive 1206. In one implementation, CPU 1201 includes a level 1 cache 1210 and a level 2 cache 1212, to temporarily store data and hence reduce the number of memory access cycles made to the hard drive 1208, thereby improving processing speed and throughput.

CPU 1201, memory controller 1202, and various memory devices are interconnected via one or more buses (not shown). The details of the bus that is used in this implementation are not particularly relevant to understanding the subject matter of interest being discussed herein. However, it will be understood that such a bus might include one or more of serial and parallel buses, a memory bus, a peripheral bus, and a processor or local bus, using any of a variety of bus architectures. By way of example, such architectures can include an Industry Standard Architecture (ISA) bus, a Micro Channel Architecture (MCA) bus, an Enhanced ISA (EISA) bus, a Video Electronics Standards Association (VESA) local bus, and a Peripheral Component Interconnects (PCI) bus also known as a Mezzanine bus.

In one implementation, CPU 1201, memory controller 1202, ROM 1203, and RAM 1206 are integrated onto a common module 1214. In this implementation, ROM 1203 is configured as a flash ROM that is connected to memory controller 1202 via a PCI bus and a ROM bus (neither of which are shown). RAM 1206 is configured as multiple Double Data Rate Synchronous Dynamic RAM (DDR SDRAM) modules that are independently controlled by memory controller 1202 via separate buses (not shown). Hard disk drive 1208 and portable media drive 1205 are shown connected to the memory controller 1202 via the PCI bus and an AT Attachment (ATA) bus 1216. However, in other implementations, dedicated data bus structures of different types can also be applied in the alternative.

A graphics processing unit 1220 and a video encoder 1222 form a video processing pipeline for high speed and high resolution (e.g., High Definition) graphics processing. Data are carried from graphics processing unit (GPU) 1220 to video encoder 1222 via a digital video bus (not shown). Lightweight messages generated by the system applications (e.g., pop ups) are displayed by using a GPU 1220 interrupt to schedule code to render popup into an overlay. The amount of memory used for an overlay depends on the overlay area size and the overlay preferably scales with screen resolution. Where a full user interface is used by the concurrent system application, it is preferable to use a resolution independent of application resolution. A scaler may be used to set this resolution such that the need to change frequency and cause a TV resync is eliminated.

An audio processing unit 1224 and an audio codec (coder/decoder) 1226 form a corresponding audio processing pipeline for multi-channel audio processing of various digital audio formats. Audio data are carried between audio processing unit 1224 and audio codec 1226 via a communication link (not shown). The video and audio processing pipelines output data to an A/V (audio/video) port 1228 for transmission to a television or other display. In the illustrated implementation, video and audio processing components 1220-828 are mounted on module 214.

FIG. 12 shows module 1214 including a USB host controller 1230 and a network interface 1232. USB host controller 1230 is shown in communication with CPU 1201 and memory controller 1202 via a bus (e.g., PCI bus) and serves as host for peripheral controllers 1204(1)-804(4). Network interface 1232 provides access to a network (e.g., Internet, home network, etc.) and may be any of a wide variety of various wire or wireless interface components including an Ethernet card, a modem, a wireless access card, a Bluetooth module, a cable modem, and the like.

In the implementation depicted in FIG. 12 console 1200 includes a controller support subassembly 1240 for supporting four controllers 1204(1)-1204(4). The controller support subassembly 1240 includes any hardware and software components needed to support wired and wireless operation with an external control device, such as for example, a media and game controller. A front panel I/O subassembly 1242 supports the multiple functionalities of power button 1212, the eject button 1213, as well as any LEDs (light emitting diodes) or other indicators exposed on the outer surface of console 1202. Subassemblies 1240 and 1242 are in communication with module 1214 via one or more cable assemblies 1244. In other implementations, console 1200 can include additional controller subassemblies. The illustrated implementation also shows an optical I/O interface 1235 that is configured to send and receive signals that can be communicated to module 1214.

MUs 1240(1) and 1240(2) are illustrated as being connectable to MU ports "A" 1230(1) and "B" 1230(2) respectively. Additional MUs (e.g., MUs 1240(3)-840(6)) are illustrated as being connectable to controllers 1204(1) and 1204(3), i.e., two MUs for each controller. Controllers 1204(2) and 1204(4) can also be configured to receive MUs (not shown). Each MU 1240 offers additional storage on which games, game parameters, and other data may be stored. In some implementations, the other data can include any of a digital game component, an executable gaming application, an instruction set for expanding a gaming application, and a media file. When inserted into console 1200 or a controller, MU 1240 can be accessed by memory controller 1202. A system power supply module 1250 provides power to the components of gaming system 1200. A fan 1252 cools the circuitry within console 1200. A microcontroller unit 1254 is also provided.

An application 1260 comprising machine instructions is stored on hard disk drive 1208. When console 1200 is powered on, various portions of application 1260 are loaded into RAM 1206, and/or caches 1210 and 1212, for execution on CPU 1201, wherein application 1260 is one such example. Various applications can be stored on hard disk drive 1208 for execution on CPU 1201.

Gaming and media system 1200 may be operated as a standalone system by simply connecting the system to monitor 16 (FIG. 1), a television, a video projector, or other display device. In this standalone mode, gaming and media system 1200 enables one or more players to play games, or enjoy digital media, e.g., by watching movies, or listening to music. However, with the integration of broadband connectivity made available through network interface 1232, gaming and media system 1200 may further be operated as a participant in a larger network gaming community.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

What is claimed is:

1. A semiconductor photosensor comprising:
   at least one visible light pixel each having a visible light sensitive region in a substrate;
   an infrared (IR) pixel having an IR light sensitive region in the substrate, wherein the IR light sensitive region is below the visible light sensitive region of at least one visible light pixel;
   a charge accumulation region in the substrate;
   a well in the substrate between the charge accumulation region and the visible light sensitive region of at least one visible light pixel, wherein the well is configured to provide electrical isolation between the charge accumulation region and the visible light sensitive region of at least one visible light pixel; and
   an electrode above the charge accumulation region that is configured to provide a voltage that generates a potential well in the charge accumulation region to accumulate charges generated in the IR light sensitive region.

2. The semiconductor photosensor of claim 1, wherein the well is a p-well.

3. The semiconductor photosensor of claim 1, further comprising:
   a filter overlaying the visible light sensitive region of a visible light pixel of the at least one visible pixel and at least a portion of the IR sensitive region of the IR pixel, wherein the filter is configured to pass visible and IR light.

4. The semiconductor photosensor of claim 1, wherein the semiconductor photosensor is arranged as a pattern that includes groupings of three visible light pixels of different colors and a charge accumulation region for an IR pixel.

5. The semiconductor photosensor of claim 4, wherein the three visible light pixels in the grouping include a green pixel, a blue pixel and a red pixel, wherein the green pixel is approximately twice the surface area as the red pixel and the blue pixel.

6. The semiconductor photosensor of claim 5, wherein the charge accumulation region covers a surface area that is smaller than any of the visible light pixels.

7. The semiconductor photosensor of claim 4, wherein the IR light sensitive region associated with the charge accumulation region has an effective collection region below portions of a plurality of different visible light pixels.

8. The semiconductor photosensor of claim 1, further comprising:
   an optical shield over the electrode.

9. A method of operating a semiconductor photosensor comprising:
   providing a high potential to a photogate above a charge accumulation region in a substrate to create a potential well in the charge accumulation region, wherein the charge accumulation region is surrounded by a p-well in the substrate, wherein the potential well accumulates charges generated in an IR light sensitive region in the substrate that is below a visible light sensitive region in the substrate;
   providing a signal to a first transfer gate to cause charges to transfer from the charge accumulation region to an IR light sensing node;
   providing a signal to a second transfer gate to cause charges to transfer from the visible light sensitive region to a visible light sensing node for a first visible light pixel, wherein the charge accumulation region is separated from the visible light sensitive region by the p-well that provides electrical isolation between the charge accumulation region and the visible light sensitive region; and
   reading the IR light sensing node and the visible light sensing node.

10. The method of claim 9, wherein the visible light sensitive region is a photodiode that comprises an n-doped region.

11. The method of claim 9, further comprising:
   forming an RGB image from readings from visible pixels;
   forming an IR image from readings from IR pixels; and
   determining a depth to features in the RGB image based on the IR image.

12. A 3D depth camera, comprising:
   a semiconductor photosensor array including:
      a plurality of visible light pixels, each visible light pixel includes a photodiode in a substrate;
      a plurality of infra-red (IR) pixels, wherein each of the infra-red (IR) pixels includes an IR light sensitive region in the substrate below at least a portion of at least one of the photodiodes;
      a charge accumulation region associated with each of the IR pixels, the charge accumulation region is in the substrate and is configured to accumulate charges generated in the IR light sensitive region of the associated IR pixel;
      a p-well region associated with each of the charge accumulation regions, wherein each p-well region is configured to separate the associated charge accumulation region from one or more adjacent photodiodes, wherein the p-well region is configured to provide electrical isolation between the associated charge accumulation region and the one or more adjacent photodiodes; and
      a photogate associated with each of the charge accumulation regions, wherein the photogate is configured to provide a voltage that generates a potential well inside of the p-well region associated with the charge accumulation region to accumulate the charges generated in the IR light sensitive region into the associated accumulation region.

13. The semiconductor photosensor array of claim 12, wherein the plurality of visible light pixels each comprise a filter that passes visible light of a selected wavelength range and IR light.

14. The semiconductor photosensor array of claim 12, further comprising a control circuit that is configured to provide a signal to the photogate associated with each of the charge accumulation regions to accumulate charges formed in the IR light sensitive regions.

15. The semiconductor photosensor array of claim 12, wherein the plurality of visible light pixels and the charge accumulation region are arranged as a pattern that includes groupings of three visible light pixels of different colors and a charge accumulation region for an IR pixel.

16. The semiconductor photosensor array of claim 12, wherein the charge accumulation region for a single IR pixel is configured to accumulate charges from an IR light sensitive region that is below at least a portion of a photodiode of a red pixel, a photodiode of blue pixel, and a photodiode of a green pixel.

17. The semiconductor photosensor array of claim 12, wherein the IR charge accumulation region covers a surface area that is smaller than any of the visible light pixels.

18. The semiconductor photosensor array of claim 12, further comprising:
    an optical shield over the photogate associated with each of the charge accumulation regions.

19. The semiconductor photosensor array of claim 12, wherein the substrate is p-type, wherein the photodiodes comprise n-type regions within the p-type substrate.

20. The semiconductor photosensor array of claim 19, wherein the p-well region is doped at a concentration that is higher than the p-type substrate.

* * * * *